United States Patent [19]

Berger

[11] Patent Number: 5,754,054
[45] Date of Patent: May 19, 1998

[54] APPARATUS AND METHOD FOR DETERMINING THE SOURCE AND STRENGTH OF ELECTRO-MAGNETIC EMISSIONS

[75] Inventor: Stephen Berger, Georgetown, Tex.

[73] Assignee: Siemens Rolm Communications Inc., Iselin, N.J.

[21] Appl. No.: 672,737

[22] Filed: Jun. 28, 1996

[51] Int. Cl.$^6$ .................. G01R 27/02; G01R 31/00; H01Q 17/00
[52] U.S. Cl. .................. 324/627; 324/95; 343/703
[58] Field of Search .................. 324/627, 628, 324/95, 96, 244, 261, 260, 259; 343/703

[56] References Cited

U.S. PATENT DOCUMENTS

| | | | |
|---|---|---|---|
| 5,285,164 | 2/1994 | Wong | 324/628 |
| 5,404,098 | 4/1995 | Osburn | 324/95 |
| 5,514,971 | 5/1996 | Hankui et al. | 324/639 |
| 5,585,808 | 12/1996 | Wysome | 343/703 |
| 5,589,773 | 12/1996 | Berger et al. | 324/261 |

OTHER PUBLICATIONS

WO 9303387A1, Abstract, Podgorski etano, "Broadband Antennas and Electromagnetic Field Simulators", Feb. 18, 1993.

Primary Examiner—Walter E. Snow

[57] ABSTRACT

A method for operating a TEM cell to determine the characteristics of a radiation source in a circuit. The circuit is placed in the TEM cell such that the relative orientation of the circuit and the TEM cell is measurable. The TEM cell provides an output signal indicative of the energy radiated by the circuit when the circuit is operated in the TEM cell. The output signal of the TEM cell is measured for at least 6 different relative orientations of the circuit and the TEM cell. The electric and magnetic dipole moments of a radiation source having an orientation and physical dimension associated therewith are determined from the measured output signals. The electric and magnetic dipole moments determined from the measured output values are compared to moments predicted by each of a plurality of antenna types to provide an estimate of the orientation of the radiation source relative to the circuit. In addition, embodiments of the present invention may also measure the output signal of the TEM cell as a function of frequency for at least one of the different relative orientations. This information may be used to determine a physical dimension associated with the radiation source. In one embodiment of the present invention, the measured output signal is evaluated as a harmonic series. In another embodiment of the present invention, the output signal of the TEM cell at a predetermined frequency is measured as a function of time to determine the modulation of the output signal.

6 Claims, 3 Drawing Sheets

APPARATUS AND METHOD FOR DETERMINING THE SOURCE AND STRENGTH OF ELECTRO-MAGNETIC EMISSIONS

FIELD OF THE INVENTION

The present invention relates to radiating electromagnetic sources, and more particularly, to an improved method and apparatus for determining the source of an electromagnetic emission in a circuit.

BACKGROUND OF THE INVENTION

The measurement of electromagnetic emissions from circuits and electrical appliances is required to meet FCC emission requirements that assure that the circuitry will not interfere with other electrical equipment. Traditionally, such compliance measurements were made on an Open Area Test Site(OATS) and consisted of measuring the strength of the electromagnetic emissions generated by the circuit under test as a function of frequency. In OATS measurements, an antenna in the far field is used to measure the strength of the emissions from the radiating source. This type of measurement is difficult to perform in the laboratory, and hence, presents difficulties when a circuit is out of compliance. OATS measurements require the engineer to make repeated trips to the test site each time the engineer alters the circuit in an attempt to bring the circuit into compliance.

Because of the inconvenience and cost of transporting equipment to and from an OAT site, alternative systems for measuring the energy radiated from a device have been devised. One prior art device that can be used for this purpose is referred to as a Transverse Electromagnetic (TEM) cell. A TEM cell is a large metallic cell into which the device to be tested is placed. The cell is analogous to a coaxial cable. A plate running through the center of the cell is analogous to the center conductor of a coaxial cable, the outer walls of the cell are analogous to the outer conductor of a conventional coaxial cable. Measurements of the potential between the plate and the walls of the cell taken at one end of the cell provide a measure of the energy emitted by the device under test as a function of frequency. These cells are described in more detail in "Generation of Standard E M fields Using TEM Transmission Cells", M. L. Crawford, in IEEE Transactions on Electromagnetic Compatibility, Vol. EMC-16, No.4, 1974, pp 189–195 which is hereby incorporated by reference. Various modifications of TEM cells have been made to extend the cell design to the gigahertz range (GTEM cells) and to provide alternative cell constructions such as the wire cells. As used herein, the term TEM cell includes these later cell designs and other cells based on the same measurement principles.

TEM cells avoid the problems inherent in transporting a device under test to and from a remote site to verify the performance of the device. However, the engineer must still determine what component or components in the device are causing the device to radiate when the device does not meet FCC or analogous radiation standards. In a complex circuit having large numbers of components and connecting paths, locating the specific component can be quite difficult.

Broadly, it is the object of the present invention to provide an improved method and apparatus for identifying the components responsible for radiating energy within a circuit.

These and other objects of the present invention will become apparent to those skilled in the art from the following detailed description of the invention and the accompanying drawings.

SUMMARY OF THE INVENTION

The present invention is a method for operating a TEM cell to determine the characteristics of a radiation source in a circuit. The circuit is placed in the TEM cell such that the relative orientation of the circuit and the TEM cell is measurable. The TEM cell provides an output signal indicative of the energy radiated by the circuit when the circuit is operated in the TEM cell. In a method according to the present invention, the output signal of the TEM cell is measured for at least 6 different relative orientations of the circuit and the TEM cell. The electric and magnetic dipole moments of a radiation source having an orientation and physical dimension associated therewith with respect to the circuit are determined from the measured output signals. The electric and magnetic dipole moments determined from the measured output values are compared to moments predicted by each of a plurality of antenna types to provide an estimate of the orientation of the radiation source relative to the circuit. In addition, embodiments of the present invention may also measure the output signal of the TEM cell as a function of frequency for at least one of the different relative orientations. This information may be used to determine a physical dimension associated with the radiation source. In one embodiment of the present invention, the measured output signal is analyzed for a harmonic series. In another embodiment of the present invention, the output signal of the TEM cell at a predetermined frequency is measured as function of time to determine the modulation of the output signal.

DETAILED DESCRIPTION OF THE PREFERRED EMBODIMENTS OF THE INVENTION

Assume that a TEM cell is used to test a device for compliance with FCC regulations related to electromagnetic emissions. Assume further that the device does not meet FCC regulations. An engineer generally must now determine the cause of the test failure and take some action to correct the problem. Determining the cause of the test failure generally requires that the engineer determine what portion or portions of the device are emitting excessive electromagnetic energy. For example, there may be a specific wire connecting two electronic components within the device that is emitting excessive energy. Frequently, the engineer may then decide to alter the electronic layout or design of the device to reduce the electromagnetic emission from the portion or portions of the device that are emitting excessive energy. By one or more iterations of this process, the engineer may be successful in bringing the device into compliance with FCC regulations.

The present invention may be used to determine the radiating source or sources that are responsible for the test failure. As will be explained in detail below, the characteristics of the source are determined by making a number of measurements with a TEM cell and analyzing the results. With sufficient measurements, the electric and magnetic dipole moments of one or more sources can usually be determined. By examining the harmonic content and amplitude of the actual radiated spectrum, information may be derived about the signal which is feeding a source and the frequency of maximum efficiency of the radiating source antennae. Since the antenna typically has its maximum efficiency at the frequency at which its physical size permits resonance, the frequency of maximum efficiency provides information about the size of the source. In addition to the size and driving signal, these measurements can be used to determine the impedance of the source (eg. a current loop versus a voltage potential) and the orientation of the source within the device. Finally, it is often possible to derive information about the modulation of the driving signal. The output of the present invention can provide information such as "the radiated signal is coming from a 10 cm current loop aligned vertically within the product and the loop is being driven by a 4 MHz data signal which contains ASCII "H's"". The circuit design and layout can then be reviewed to determine locations within the device that could be radiating such a signal.

For the purposes of this discussion, the "source" is defined as the portion of the circuit that is actually radiating a given emission. Different parts of a product may be radiating at different frequencies. It should also be noted however, that different circuits within a product may be radiating at the same frequency.

Figure 1:
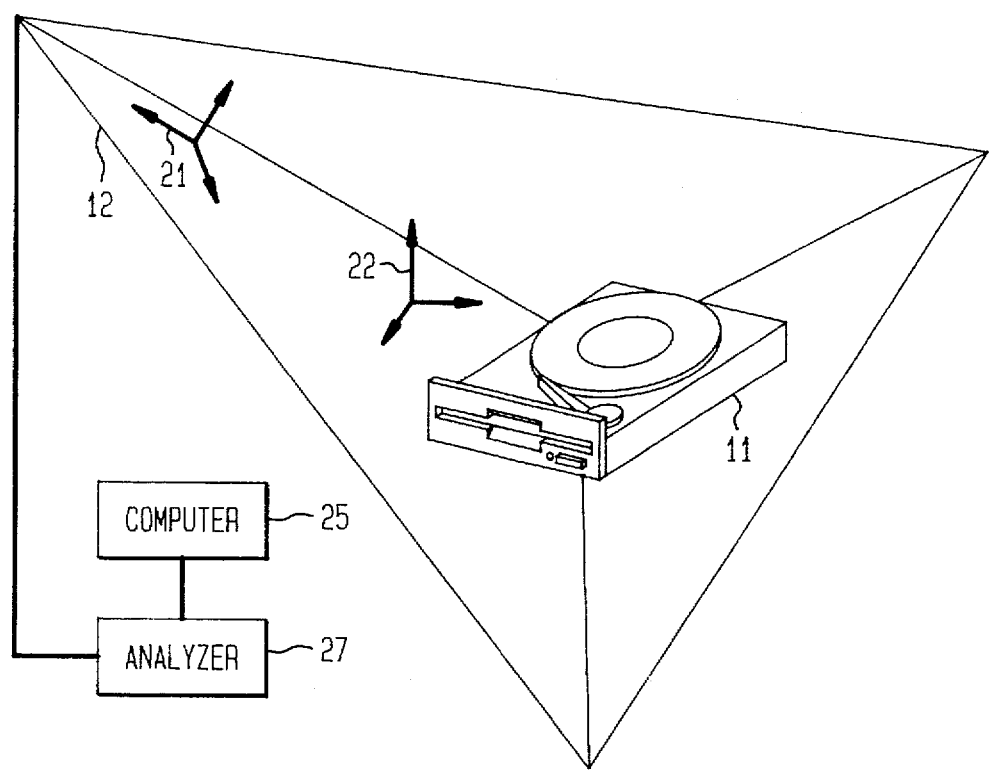
FIG. 1 is an illustration of a device under test in a TEM cell.

Refer now to FIG. 1 which illustrates a device 11 under test in a TEM cell. In the example shown in FIG. 1, the TEM cell 12 has an outer shell that is pyramidal in shape. In general, the measured potential from the TEM cell depends only on the EM emissions from device 11 and the relative orientation of device 11 and TEM cell 12, provided device 11 remains within a test volume that may be computed for any specific cell design. The relative orientation of device 11 and TEM cell 12 may be specified by two angles, T and L which provide the relative orientation of a first coordinate system 22 defined with respect to device 11 and a second coordinate system 21 defined with respect to TEM cell 12. The specific details of adjusting the orientation of the TEM cell relative to the device under test are known to those skilled in the art. The reader is referred to "A Variable Position, Gravity Down G-TEM Configuration" in the *Proceedings of the EMC Symposium on Electromagnetic Compatibility* in Zurich, Switzerland, Mar. 7–9, 1995 pp. 465–470, which is hereby incorporated by reference, and co-pending U.S. patent application Ser. No. 08/321,699 filed on Oct. 12, 1994, now issued as U.S. Pat. No. 5,589,773 for "System and Method for Making Electromagnetic Measurements Using a Tiltable Transverse Electromagnetic Cell and a Fixed Tilt Sample Holder" (issued Dec. 31, 1996) which is also incorporated by reference. The above-referenced angles, T and L, are the same angles that are defined in the U.S. Pat. No. 5,589,773.

As is well known to those of skill in the art, and as described in the references identified in the preceding paragraph, the TEM cell can first be used to determine whether the device under test is in compliance with FCC regulations. TEM cell measurements are taken for three different orthogonal orientations between the device under test and the TEM cell. A calculation is then performed to determine whether the total electromagnetic power generated by the device under test exceeds the limits specified by FCC regulations.

During the test to determine whether the device under test is in compliance with FCC regulations, a spectrum analyzer can be used to determine the relative magnitude of electromagnetic energy that is being radiated at various frequencies. Typically, there are a limited number of radiating sources in the device that radiate energy at relatively large magnitudes. These radiating sources generally give rise to a limited number of frequencies at which the magnitude of emitted energy is substantially greater than at other frequencies. A spectrum analyzer can be used to determine the frequencies at which the radiated energy is relatively large, and the present invention can be used to isolate one or more radiation sources that are radiating at these frequencies. Frequently, if an engineer is able to substantially reduce the magnitude of radiation generated by the isolated radiation sources, the device under test can be brought into compliance with FCC regulations. Therefore, during compliance testing, an engineer can identify one or more frequencies that are of primary concern in attempting to bring a device under test into compliance.

Consider the case in which an engineer has identified a single radiation frequency that is of primary concern. The method of the present invention can assist the engineer in identifying one or more sources that are radiating at the selected frequency.

It can be shown that the measured voltage from the cell, when properly normalized, is related to the electric dipole moments ($P_x$, $P_y$, $P_z$) and the magnetic dipole moments ($M_x$, $M_y$, $M_z$) of the circuit element in the device providing the emissions by the following equation.

$$|V|^2 = [P_y F_y + P_x F_x + P_z F_z]^2 + k_0^2 [M_y G_y + M_x G_x + M_z G_z]^2 \quad (1)$$

where $$F_y = \cos(L) \quad (2)$$

$$F_x = \cos(T + 225)\sin(L)$$

$$F_z = \cos(T + 135)\sin(L)$$

$$G_y = \sin(L)\cos(45)$$

$$G_x = \frac{\sin(T + 45)}{\sqrt{2}} + \frac{\cos(t + 45)\cos(L)}{\sqrt{2}}$$

$$G_z = \frac{\sin(T - 45)}{\sqrt{2}} + \frac{\cos(T - 45)\cos(L)}{\sqrt{2}}$$

As used herein, the normalized voltage is the voltage read from the cell adjusted for factors such as the size of the TEM cell. The reader is directed to National Bureau of Standards Technical Notes 1013, 1017, 1040, and 1064 from the U.S. Department of Commerce for a more detailed explanation of the normalization. The factor $k_0$ is the wave number constant that varies with the frequencies being tested.

From the above discussion, it will be apparent that the magnetic and electric dipole moments may be ascertained at various frequencies by making a number of different measurements at each frequency. The measured values of V are then used to construct a set of equations for the dipole moments using Eq. (1). The different measurements are made at different values of T and L. The different orientations are accomplished by moving the TEM cell with respect to the device under test. In the preferred embodiment of the present invention, the TEM cell is moved, since not all devices can be operated in all of the orientations needed to generate a complete set of equations. However, in some cases, the device under test can be moved while the TEM cell remains fixed. The minimum number of measurements needed to determine the dipole moments is 6. However, as will be explained in more detail below, additional measurements are often useful. The various measurements are analyzed by a computer 25 and a spectrum analyzer 27 whose output is fed to computer 25.

In the preferred embodiment of the present invention, the magnitude and orientation of the equivalent electric and magnetic dipoles are computed from the above described moments for each frequency of measurement.

As noted above, the goal of the present invention is to provide information which the circuit designer can use to identify each significant source of the emissions from the device under test so that the circuit designer can make changes to the circuit to reduce the emissions. Each source of emissions may be viewed as an antenna that is fed by a signal. The characteristics of the antenna such as its physical dimensions and type may be deduced from the above described moments and frequency spectrum of the emissions. The signal feeding the antenna may often be deduced from an examination of the modulation of the emission as a function of time.

As noted above, the dipole moments described above may be used to identify the antenna type. Each radiating source provides an electric and a magnetic dipole moment which are vector quantities whose Cartesian components appear in Eq. (1). The two simplest forms of antennae are a linear conductor and a current loop. A current loop gives rise to a radiator that is primarily magnetic with the magnetic dipole moment being perpendicular to the plane of the current loop. A linear conductor that is acting as an electric dipole radiator is characterized by an electric dipole moment that is much greater than the magnetic dipole moment. In this case, the direction of the linear conductor is parallel to the measured electric dipole moment.

Since more complex antennae shapes are clearly possible, the number of measurements used to determine the parameters of Eq. (1) are preferably sufficient to test the fit to the simple radiator types. For example, if both the electric and magnetic dipole moments for a single radiator are significant, a more complex radiator must be present. This situation is also evident if the fit of the observed measurements to Eq (1) requires a large number of dipole terms. In addition, the ratio of the magnetic to electric dipole moments can be used to distinguish between different antenna types. In the preferred embodiment of the present invention, a number of different antenna types are stored in the computer. The measured values are then compared with the patterns predicted from the various antenna types. In the preferred embodiment of the present invention, the library of antenna types includes slot antennae, array antennae, and different loadings of various simple antennae such as a top loaded monopole antenna.

In matching the observed measurements to those predicted by various antenna models, computing the gain of the source has been found to be useful. Thus, comparing the gain and the E/M ratio of the radiating source against the expected gain and E/M ratio of various antenna types may be helpful in determining the type of antenna that is most analogous to the radiating source. The gain of the source is defined to be the ratio of the peak radiation intensity observed to the intensity that would be observed if the radiator was isotropic.

The emission spectrum of the device as a function of frequency is also measured. The measured spectrum is examined for harmonically related emissions. For any given type of antenna, the antenna will emit a harmonic spectrum whose fundamental frequency is related to the signal driving the antenna. In addition, the magnitude of the various harmonics provides information as to the physical dimensions of the antenna.

Methods for extracting the fundamental frequency of a harmonic series in a spectrum are well known to those skilled in the art, and hence, will not be discussed in detail here. For the purposes of the present invention, it is sufficient to note that for each antenna that is radiating energy, one expects a set of peaks in the emission spectrum spaced at integer multiples of the fundamental frequency. The peak corresponding to the fundamental is usually the peak with the greatest power. When an antenna is driven by a square wave such as a digital pulse, the resulting emissions spectrum is spaced at intervals of the pulse frequency.

The above discussion assumed that the device under test has a single dominant source of emission. If multiple antennae are present, the moment analysis performed above can be repeated for each antenna using the harmonic analysis to isolate the contributions of each antenna. In this regard, it should be noted that Eq. (1) assumes a single dominant radiating source. If there is more than one significant source, each source will contribute to the observed signal in the same manner. Hence, Eq. (1) can be modified by adding terms for each source. If the sources have different orientations, then they can be separated by making sufficient angular measurements to solve the now expanded set of simultaneous equations.

Harmonic analysis is also useful in detecting the presence of multiple antennae and separating the contributions of each antenna. If the individual antenna have significantly different physical dimensions, the contributions of each antenna can be separated once the fundamental of each antenna has been determined. In this case, the emission spectrum is fit to a plurality of harmonic series. Since the separation of the harmonic spectra does not rely on the sources having different orientations, this mode of analysis is particularly useful in identifying sources having the same orientation.

While data as to the physical size and orientation of each source may be sufficient to identify the circuit components corresponding to each of the sources, there may still be components of similar size and orientation that are contributing to the emissions. For example, printed circuit cards often include parallel traces of approximately the same length. If one of these traces is a source of radiation, information identifying the source as being a conductor of a specific length and orientation will be insufficient to isolate the source. In such cases, additional information may be needed.

One source of information is the modulation pattern of the source. For example, if the source is a conductor in a bus, the emissions from the source will be modulated by the data pattern on the bus. Hence, examination of the modulation pattern, i.e., signal strength as a function of time, may provide sufficient information to allow the source to be identified in the presence of other circuit components having the same dimensions and orientation.

The modulation analysis may be performed at a number of frequencies to allow the contributions from different radiating sources to be separated. For example, the analysis can be carried out at each fundamental frequency detected in the harmonic analysis. If the circuit under test is clocked at a known clock rate, the modulation analysis may be carried out at the clock frequency. Furthermore, the phase of the signal relative to the frequency at which the modulation analysis is performed may be varied to provide further information about the radiating circuit element. Potentials are applied to various conductors at predetermined delays with respect to clock pulses; hence, the phase of the modulated signal relative to the circuit clock can provide additional information on the source of the radiation.

Furthermore, the data traveling over the various paths in a circuit may often be changed by the designer. For example, consider the case in which the source is a conductor in a bus that connects the memory to the processor in a computer. The emissions from the circuit will be modulated in a pattern determined by the contents of the data being transferred between the memory and the processor. By changing the data and examining the changes in the modulation pattern, the designer may be able to determine that the source is the bus, and even the specific conductor in the bus that is radiating.

Figure 2:
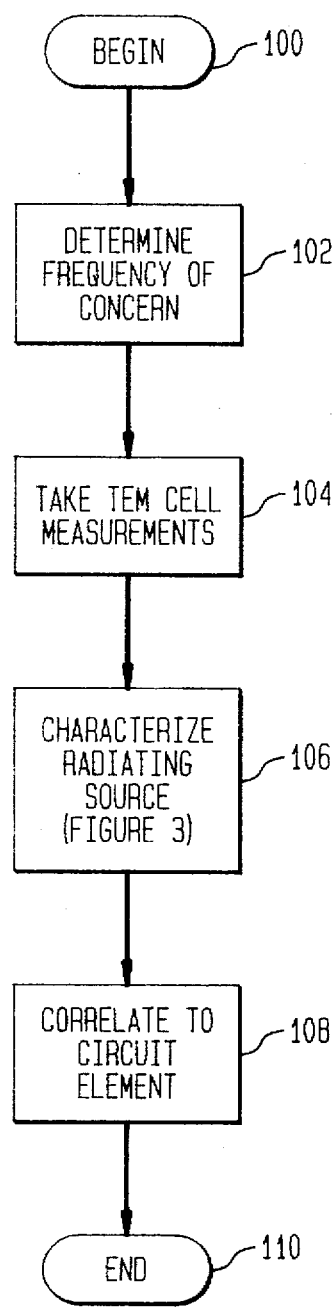
FIG. 2 is a flow chart illustrating a method, according to the present invention, for identifying a radiating source in a device under test.

FIG. 2 is a flow chart of the preferred method of the present invention for identifying a radiating source in a device under test. The method begins at an initial block 100.

At a process block 102, one or more radiation frequencies are identified for evaluation. A spectrum analyzer can be used to determine the frequencies at which relatively large amounts of electromagnetic energy are being radiated. A harmonic series analysis can be used to identify which of these frequencies are fundamental frequencies of radiation. These fundamental frequencies are typically identified for evaluation. In some situations, there may only be one frequency of concern.

At a process block 104, TEM cell measurements are taken. As described above, measurements are preferably taken for at least six different orientations of the device under test relative to the TEM cell. As illustrated in FIG. 1, the measurements from the TEM cell are provided to the analyzer 27. The output of the analyzer 27 is provided to the computer 25. The computer 25 may store data related to the measurements from the TEM cell for further processing.

Figure 3:
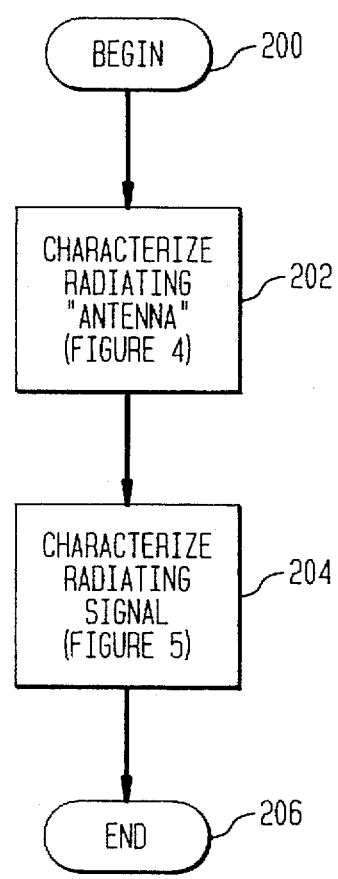
FIG. 3 is a flow chart illustrating a method, according to the present invention, for characterizing a radiating source.

After all of the TEM cell measurements have been taken, the method of FIG. 2 advances to a process block 106. At the process block 106, the TEM cell measurements are used to determine the electromagnetic radiation characteristics of the radiating source. The preferred method of characterizing the radiating source is illustrated in FIG. 3. This method may be performed, in part or in total, by one or more computer programs running on the computer 25.

At a process block 108, the characteristics of the radiating source, as determined at the process block 106, are used to identify one or more circuit elements in the device under test that are radiating at the frequency of concern. These circuit elements can then be modified in some way to reduce the electromagnetic emissions. The method of FIG. 2 ends at a terminal block 110.

As illustrated in FIG. 3, the preferred method of characterizing the radiating source begins at a process block 200. At a process block 202, the TEM cell measurements are used to determine the electromagnetic radiation characteristics of one or more physical structures that are radiating at the frequency of concern. The preferred method of characterizing a radiating structure or antenna is illustrated in FIG. 4.

Figure 5:
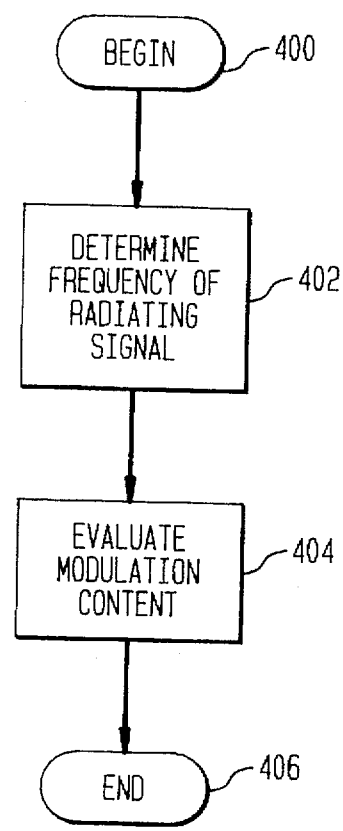
FIG. 5 is a flow chart illustrating a method, according to the present invention, for characterizing a signal that is driving a radiating source.

At a process block 204, the TEM cell measurements are used to determine selected characteristics of the signal that is driving a radiating structure. The preferred method of characterizing a radiating signal is illustrated in FIG. 5. The method of FIG. 3 ends at a terminal block 206.

Figure 4:
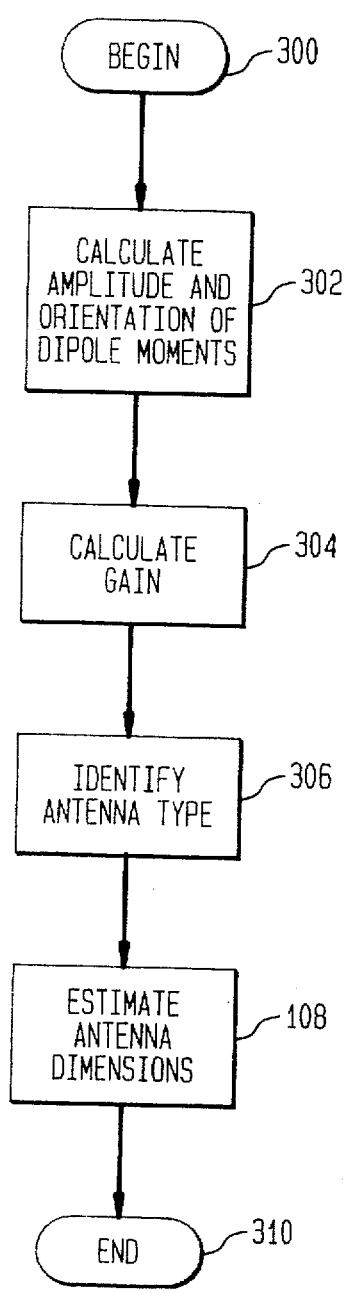
FIG. 4 is a flow chart illustrating a method, according to the present invention, for characterizing a radiating source in terms of the physical radiation structure.

As illustrated in FIG. 4, the preferred method of characterizing a radiating structure begins at a process block 300.

At a process block 302, the amplitude and orientation of the electric and magnetic dipole moments of the radiating source are calculated. At a process block 304, the gain of the radiating source is determined. The calculations of process blocks 302 and 304 are described above.

At a process block 306, the characteristics of the radiating source are compared with the radiating characteristics of known antenna types to determine the type of physical structure that is radiating at the frequency of concern. First, the ratio of the electric component to the magnetic component is determined. If this ratio is large, then the radiating source may be an electric dipole. If the ratio is small, then the radiating source may be a current loop. If the ratio is closer to 1, then the characteristics of the radiating source are compared against more complex antenna types, such as a slot antenna or an array antenna.

At a process block 308, the dimensions of the radiating structure are estimated. As described above, this process is accomplished by determining the resonant frequency of the radiating structure. The method of FIG. 4 ends at a terminal block 310.

As illustrated in FIG. 5, the preferred method of characterizing a radiating signal begins at a process block 400. At a process block 402, the frequency of the radiating signal is determined. As described above, a harmonic series analysis can be used for this purpose.

At a process block 404, the modulation content of the radiating signal is evaluated. During this process, it may be helpful to select certain data patterns to be transferred across data buses and other lines. Based on the radiation frequencies detected by the analyzer 27, a data pattern may be detected as being generated at the radiating source. Based on the lines over which a corresponding pattern has been transferred, the radiating circuit element may be identified. The method of FIG. 5 ends at a terminal block 406.

Referring again to the process block 106 of FIG. 2, the preferred method of the present invention is generally able to determine the following information about the radiating source: the impedance of the radiating circuit; the alignment of the radiating source; the probable size of the source; the fundamental frequency of the driving signal; and the modulation of the driving signal. Some or all of this information is utilized at the process block 108 to determine the circuit elements of the device under test that are radiating at the frequency of concern. The circuit diagram and other technical information about the device under test can be reviewed to identify circuit elements that could have the radiating characteristics defined in the process block 106. An engineer may determine, for example, that only one specific circuit element could possibly radiate at the appropriate impedance and alignment, have the appropriate size and be driven by a signal with the appropriate frequency and modulation content.

The process of process block 108 may also be performed, at least in part, by a computer program running on the computer 25. In this case, the computer program compares data related to the different circuit elements of the device with the characteristics of the radiating source. For example, the computer program may access the data in a computer aided design (CAD) file to determine information about various circuit elements. As a farther example, the computer program may compare the length of various wires in the device with the estimated size of the radiating source. If the computer program determines one or more matches between the circuit elements and the characteristics of the radiating source, the computer program notifies a user of this determination.

Various modifications to the present invention will become apparent to those skilled in the art from the foregoing description and accompanying drawings. Accordingly, the present invention is to be limited solely by the scope of the following claims.

What is claimed is:

1. A method for operating a TEM cell to determine the characteristics of a radiation source in a circuit, said circuit being placed in said TEM cell such that the relative orientation of said circuit and said TEM cell is measurable, said TEM cell providing an output signal indicative of the energy radiated by said circuit when said circuit is operated in said TEM cell, said method comprising the steps of:

measuring said output signal of said TEM cell for at least six different relative orientations of said circuit and said TEM cell to provide an output signal value corresponding to each of said orientations;

determining electric and magnetic dipole moments of a radiation source having an orientation and physical dimension associated therewith in said circuit from said measured output signal values; and comparing said determined electric and magnetic dipole moments to moments predicted by each of a plurality of antenna types to provide an estimate of the orientation of said radiation source relative to said circuit.

2. The method of claim 1 further comprising the step of measuring the output signal of said TEM cell as a function of frequency for at least one of said different relative orientations.

3. The method of claim 2 further determining a physical dimension associated with said radiation source.

4. The method of claim 2 further comprising fitting said measured output signal to a harmonic series.

5. The method of claim 2 further comprising the step of examining the modulation of said output signal of said TEM cell at a predetermined frequency.

6. The method of claim 1 further comprising the step of computing a gain value for said radiation source.

* * * * *